United States Patent
Coyle et al.

(10) Patent No.: US 6,858,910 B2
(45) Date of Patent: Feb. 22, 2005

(54) METHOD OF FABRICATING A MOLDED PACKAGE FOR MICROMECHANICAL DEVICES

(75) Inventors: Anthony L. Coyle, Plano, TX (US); George A. Bednarz, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/271,815

(22) Filed: Oct. 16, 2002

(65) Prior Publication Data

US 2003/0045025 A1 Mar. 6, 2003

Related U.S. Application Data

(63) Continuation of application No. 09/766,195, filed on Jan. 19, 2001, now Pat. No. 6,489,178.
(60) Provisional application No. 60/178,211, filed on Jan. 26, 2000.

(51) Int. Cl.[7] .............................................. H01L 29/82
(52) U.S. Cl. .................. 257/415; 257/417; 264/272.17; 438/51; 438/127
(58) Field of Search ................................ 257/415, 417; 264/272.17; 438/51, 127

(56) References Cited

U.S. PATENT DOCUMENTS

| | | |
|---|---|---|
| 5,061,049 A | 10/1991 | Hornbeck |
| 5,096,279 A | 3/1992 | Hornbeck et al. |
| 5,151,276 A | 9/1992 | Sato et al. |
| 5,293,511 A | 3/1994 | Poradish et al. |
| 5,331,454 A | 7/1994 | Hornbeck |
| 5,650,915 A | 7/1997 | Alfaro et al. |
| 5,729,050 A | 3/1998 | Kim |
| 5,897,338 A | 4/1999 | Kaldenberg |
| 5,917,235 A | 6/1999 | Imura |
| 5,936,758 A | 8/1999 | Fisher et al. |
| 5,939,778 A | 8/1999 | Boutin et al. |
| 5,939,785 A | 8/1999 | Klonis et al. |
| 6,534,340 B1 * | 3/2003 | Karpman et al. ........... 438/113 |

* cited by examiner

*Primary Examiner*—Jack Chen
*Assistant Examiner*—Nema Berezny
(74) *Attorney, Agent, or Firm*—Wade James Brady, III; Frederick J. Telecky, Jr.

(57) ABSTRACT

A plastic land-grid array package, a ball-grid array package, and a plastic leaded package for micromechanical components are fabricated by a molding process characterized by lining the cavity surfaces of the top and bottom mold halves with a protective plastic film, which also protects the surfaces of the components during the molding phase, selectively encapsulating the bonding pads and coupling members of the chip while leaving empty space above the components, and attaching a lid over the components. A molding method as well as a molding apparatus are provided compatible with the sensitivity of the micromechanical devices, yet flexible with regard to the technique used to assemble the chip and the substrate. Furthermore, the method disclosed is flexible with regard to the material and the properties of the substrate.

It is an aspect of the present invention to be applicable to a variety of different semiconductor micromechanical devices, for instance actuators, motors, sensors, spatial light modulators, and deformable mirror devices. In all applications, the invention achieves technical advantages as well as significant cost reduction and yield increase.

16 Claims, 3 Drawing Sheets

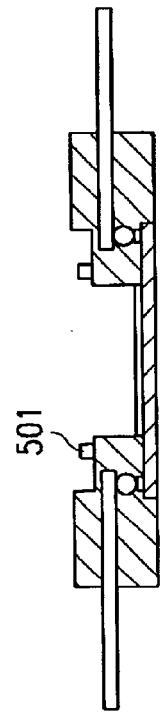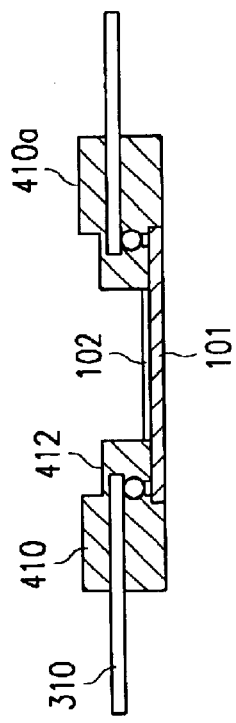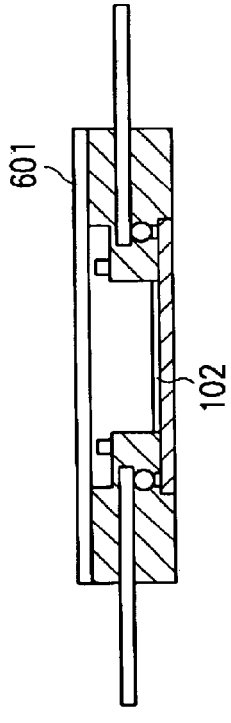
FIG. 4B  FIG. 5B  FIG. 6B
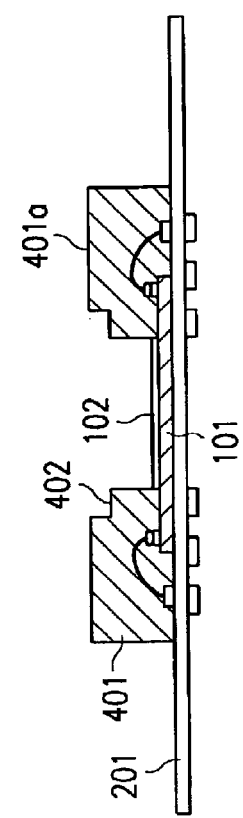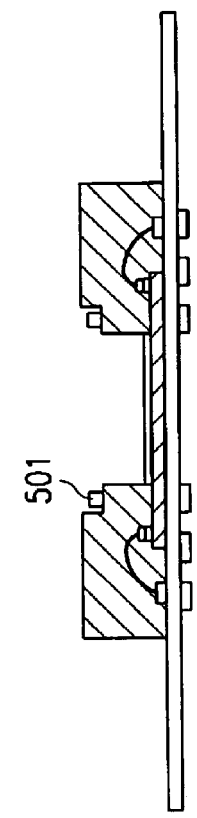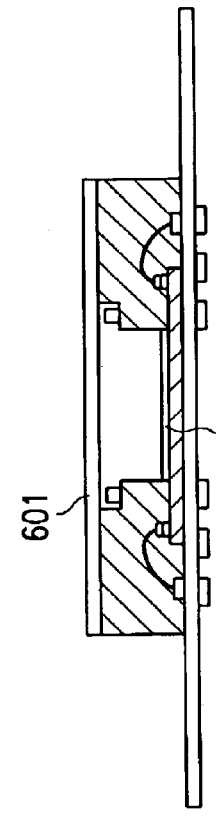
FIG. 4A  FIG. 5A  FIG. 6A

METHOD OF FABRICATING A MOLDED PACKAGE FOR MICROMECHANICAL DEVICES

This application is a continuation of application Ser. No. 09/766,195, filed Jan. 19, 2001 now U.S. Pat. No. 6,489,178, which claims priority from provisional application Ser. No. 60/178,211, filed Jan. 26, 2000.

FIELD OF THE INVENTION

The present invention is related in general to the field of semiconductor devices and processes and more specifically to the fabrication of a molded package suitable generally for micromechanical devices and specifically for digital mirror devices.

DESCRIPTION OF THE RELATED ART

Micromechanical devices include actuators, motors, sensors, spatial light modulators (SLM), digital micromirror devices or deformable mirror devices (DMD), and others. The technical potential of these devices is especially evident when the devices are integrated with semiconductor circuitry using the miniaturization capability of semiconductor technology.

SLMs are transducers that modulate incident light in a special pattern pursuant to an electrical or other input. The incident light may be modulated in phase, intensity, polarization or direction. SLMs of the deformable mirror class include micromechanical arrays of electronically addressable mirror elements or pixels, which are selectively movable or deformable. Each mirror element is movable in response to an electrical input to an integrated addressing circuit formed monolithically with the addressable mirror elements in a common substrate. Incident light is modulated in direction and/or phase by reflection from each element.

As set forth in greater detail in commonly assigned U.S. Pat. No. 5,061,049, issued on Oct. 29, 1991 (Hornbeck, "Spatial Light Modulator and Method"), deformable mirror SLMs are often referred to as DMDs in three general categories: elastomeric, membrane, and beam. The latter category includes torsion beam DMDs, cantilever beam DMDs, and flexure beam DMDs. Each movable mirror element of all three types of beam DMD includes a relatively thick metal reflector supported in a normal, undeflected position by an integral, relatively thin metal beam. In the normal position, the reflector is spaced from a substrate-supported, underlying control electrode, which may have a voltage selectively impressed thereon by the addressing circuit.

When the control electrode carries an appropriate voltage, the reflector is electrostatically attracted thereto and moves or is deflected out of the normal position toward the control electrode and the substrate. Such movement or deflection of the reflector causes deformation of its supporting beam storing therein potential energy which tends to return the reflector to its normal position when the control electrode is de-energized. The deformation of a cantilever beam comprises bending about an axis normal to the beam's axis. The deformation of a torsion beam comprises deformation by twisting about an axis parallel to the beam's axis. The deformation of a flexure beam, which is a relatively long cantilever beam connected to the reflector by a relatively short torsion beam, comprises both types of deformation, permitting the reflector to move in piston-like fashion.

A typical DMD includes an array of numerous pixels, the reflectors of each of which are selectively positioned to reflect or not to reflect light to a desired site. In order to avoid an accidental engagement of a reflector and its control electrode, a landing electrode may be added for each reflector. It has been found, though, that a deflected reflector will sometimes stick or adhere to its landing electrode. It has been postulated that such sticking is caused by intermolecular attraction between the reflector and the landing electrode or by high surface energy substances adsorbed on the surface of the landing electrode and/or on the portion of the reflector which contacts the landing electrode. Substances which may impart such high surface energy to the reflector-landing electrode interface include water vapor or other ambient gases (e.g., carbon monoxide, carbon dioxide, oxygen, nitrogen) and gases and organic components resulting from or left behind following production of the DMD. A suitable DMD package is disclosed in commonly assigned U.S. Pat. No. 5,293,511, issued on Mar. 8, 1994 (Poradish et al., "Package for a Semiconductor Device").

Sticking of the reflector to the landing electrode has been overcome by applying selected numbers, durations, shapes and magnitudes of voltage pulses to the control electrode. Detail can be found in U.S. Pat. No. 5,096,279, issued on Mar. 17, 1992 (Hornbeck et al., "Spatial Light Modulator and Method"). Further improvement of the sticking problem is disclosed in commonly assigned U.S. Pat. No. 5,331,454, issued on Jul. 19, 1994 (Hornbeck, "Low Reset Voltage Process for DID"). This patent describes a technique for passivating or lubricating the portion of the landing electrode engaged by the deformed reflector, and/or the portion of the deformed reflector which engages the landing electrode. Passivation is effected by lowering the surface energy of the landing electrode and/or the reflector, which is, in turn, effected by chemically vapor-depositing on the engageable surfaces a monolayer of a long-chain aliphatic halogenated polar compound, such as perfluoroalkyl acid. Objects do not easily, if at all, stick or adhere to low energy surfaces, which are also usually expected to be resistant to sorption thereonto of high surface-energy imparting substances such as water vapor.

Refinements of the passivation method are disclosed in U.S. Pat. No. 5,939,785, issued on Aug. 17, 1999 (Klonis et al., "Micromechanical Device including Time-release Passivant"), and U.S. Pat. No. 5,936,758, issued on Aug. 10, 1999 (Fisher et al., "Method of Passivating a Micromechanical Device within a Hermetic Package"). The method includes an enclosed source time-releasing a passivant, preferably a molecular sieve or binder impregnated with the passivant. Further, the method includes placing a predetermined quantity of the passivant in the package just after device activation, and then immediately welding a hermetic lid (free of passivant during the welding process) to the package.

Today's overall package structure for micromechanical devices and method of fabrication is expensive. This fact is in conflict with the market requirements for many applications of micromechanical devices, which put a premium at low device cost and, therefore, low package cost. The state of the art has been advanced by a recent U.S. patent application Ser. No. 09/760,517 which claims priority based upon Serial No. 60/177,446, filed Jan. 21, 2000 and entitled "Molded Package for Micromechanical Devices and Method of Fabrication", to which the present invention is related. In that patent application, transfer molding technology is used to produce a low cost package for micromechanical devices, while the surfaces of the micromechanical components are covered by a sheet-like protector during the molding process. This protective cover may be made of water-soluble polyimide. Its application and removal exhibit manufacturing difficulties.

A challenge has now arisen to conceive device structures, fabrication method and equipment features for a low-cost encapsulation technology of micromechanical devices, which provides the molding in thin, chip-scale packages without the need of additional protective cover of the component surfaces. Preferably, this concept should be based on fundamental design solutions flexible enough to be applied for different micromechanical product families and a wide spectrum of design, material and process variations. Manufacturing should be low cost and the devices stable and reliable. Preferably, these innovations should be accomplished while shortening production cycle time and increasing throughput.

SUMMARY OF THE INVENTION

According to the present invention, a plastic land-grid array package, a ball-grid array package, and a plastic leaded package for micromechanical components are fabricated by a molding process characterized by lining the cavity surfaces of the top and bottom mold halves with a protective plastic film, which also protects the surfaces of the components during the molding phase, selectively encapsulating the bonding pads and coupling members of the chip while leaving empty space above the components, and attaching a lid over the components. A molding method as well as a molding apparatus are provided compatible with the sensitivity of the micromechanical devices, yet flexible with regard to the technique used to assemble the chip and the substrate. Furthermore, the method disclosed is flexible with regard to the material and the properties of the substrate.

It is an aspect of the present invention to be applicable to a variety of different semiconductor micromechanical devices, for instance actuators, motors, sensors, spatial light modulators, and deformable mirror devices. In all applications, the invention achieves technical advantages as well as significant cost reduction and yield increase.

In a key embodiment of the invention, the micromechanical components are micromirrors for a digital mirror device. In this case, the lid is a plate made of glass or any other material transparent to light. It is another aspect of the present invention to modify the transfer molding technique so that it becomes applicable to encapsulating micromechanical devices and concurrently protects the micromechanical components during the total process (for example against dust and released chemicals), resulting in significantly higher manufacturing yield and enhanced device quality and reliability. Specially developed encapsulation materials of low viscosity and high adhesion can be used.

Another aspect of the invention is to completely embed all sensitive interconnection means (such as bonding wires, ribbons, or solder) in the molded material.

Another aspect of the invention is be applicable to a wide variety of substrates, made either of stiff or of flexible material, such as polymer-based boards or plastic films having multi-level metallization.

Another aspect of the invention is to provide the technology needed for mass-fabricating micromechanical devices in chip-scale or even chip-size packages—a necessity for many product applications in miniaturized configurations.

Another aspect of the invention is to provide ultra-thin devices free of any voids in the molded portions, and having unusually flat surfaces and high luster. The invention solves these needs by modifying the "3-P" molding technique with its film-protected mold surfaces.

As side benefits of using the "3-P" technology, the pre-assembled devices are protected against contamination and chip cracking, and the mold system avoids down-time and cost due to customary routine cleaning requirements.

Another aspect of the invention is to be applicable to batch processing, including mold chases with multiple cavities, and to easy methods for singulating, trimming and forming the devices.

Another aspect of the invention is to provide flexibility of the package structure relative to the geometry (contour and area) of the semiconductor chip containing the plurality of micromechanical components.

Another aspect of the invention is to employ the precision machining capabilities of today's mold chase manufacturers in order to obtain the flatness of the molded parts, enabling a lid (for example, glass plate) attachment in a plane parallel to the plane or the plurality of to micromechanical components.

These aspects have been achieved by the teachings of the invention concerning structure, methods and apparatus suitable for mass production. Various modifications have been employed for the assembly of the semiconductor chips, the design and material of the substrates, and the method of fabrication.

In the first embodiment of the invention, the coupling members connecting the chip bonding pads to the substrate routing line are made of bonding wires or ribbons.

In the second embodiment of the invention, the coupling members connecting the chip bonding pads to the substrate routing lines are made of solder, supplied generally in shapes of balls or bumps.

In the third embodiment of the invention, the substrate is a flexible plastic film having multi-level metal interconnections. The substrate further has terminals for attaching solder balls as means or connecting to external parts.

In the fourth embodiment of the invention, the substrate is a metallic leadframe, which has its external leads trimmed and formed at the end of the assembly and packaging process in order to comply with customer specifications.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIGS. 1 to 7 are schematic and simplified cross sections illustrating the assembly and packaging process flow for the molded micromechanical device of the invention.

FIGS. 1A to 7A illustrate the assembly and packaging process flow for the first embodiment of the invention combined with the third embodiment.

FIGS. 1B to 7B illustrate the assembly and packaging process flow for the second embodiment of the invention combined with the fourth embodiment.

FIGS. 1A and 1B depict semiconductor chips having a plurality of micromechanical components in the central area.

FIGS. 4B and 4B illustrate the step of molding encapsulation material in the peripheral areas of the chips.

FIGS. 5A and 5B illustrate the step of depositing chemical compounds onto molded ridge-like protrusions.

FIGS. 6A and 6B illustrate the step of attaching a lid onto flat surfaces of the molded frame.

FIGS. 7A and 7B illustrate the finished molded package for micromechanical devices according to the method of the invention.

FIG. 7A illustrates the step of attaching solder balls to the terminals of the substrate.

FIG. 7B illustrates the step of trimming and forming the outer leads of the leadframe of the device.

DETAILED DESCRIPTION OF THE PREFERRED EMBODIMENTS

The present invention adopts essential features of the so-called "3-P" molding technology and modifies them for preferred embodiments as illustrated in FIGS. 1A to 7A and 1B to 7B.

The term "3-P" refers to the concept of using material as "pre-packaged product". The encapsulation material is carefully cleaned from impurities and gaseous contents, and thereafter wrapped in thin plastic films. With this protection from the environment, the material is shipped to the customer, who can use it in clean condition. The wrapped product may be fabricated in various geometrical forms, for instance in elongated, narrow shapes reminiscent of pencils. Such "pencils" are preferred shapes of encapsulation due to their ease of operation in transfer molding.

The transfer molding technology was introduced to semiconductor devices (U.S. Pat. Nos. 3,716,764 and 4,043,027) as an encapsulation process, which is both gentle and reliable, and exceedingly well applicable to mass production. Over the years, transfer molding has been applied to almost all semiconductor device types. A generally recognized difficulty, however, has been the adhesion of the molding material to the cavity walls of the steel molds used in, the fabrication process. A partial solution arrived with U.S. Pat. No. 5,098,626, issued on Mar. 24, 1992 (Pas, "Method for Packing a Measured Quantity of Thermosetting Resin and Operating a Mold for Encapsulating a Component") and U.S. Pat. No. 5,431,854, issued on Jul. 11, 1995 (Pas, "Method for Pressing a Plastic, which Cures by means of a Reaction, into a Mold Cavity, a Pressing Auxiliary in Pill Form to be Used in this Method, and a Holder Composed of such Material"). The emphasis is placed on cleanliness of the molding material by prepacking and sealing it in plastic forms, which are only ruptured at time of usage. Further emphasis is on preventing the deleterious adhesion to the mold cavity walls of the molding material by covering thin continuous plastic films over the mold walls. For this purpose, the pulling forces from vacuum "dispensed" from numerous openings pressure the flexible films against the walls, thus keeping the molding material away from the walls.

The "3-P" molding technology has been expanded to fabricate thin, small-size semiconductor packages in U.S. patent application Ser. No. 09/382,921, filed on Aug. 25, 1999 (Lim et al. "Method of Encapsulating Thin Semiconductor Chip-scale Packages").

Figure 1A:
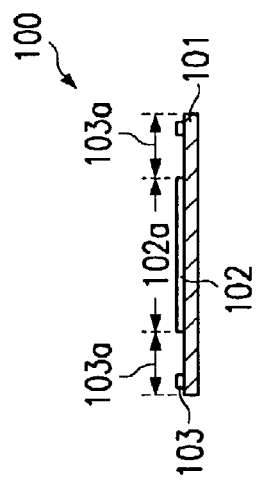
Figure 1B:
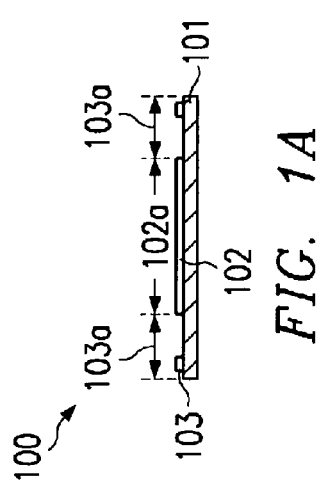

In FIGS. 1A and 1B, a semiconductor chip of the micromechanical type is shown, generally designated 100. Chip 100 is formed on and in a single-crystalline material 101, typically silicon; it includes an integrated circuit (not shown) and a plurality of micromechanical components 102 in the central area 102a of the chip. The micromechanical components are disposed in a plane. Further, chip 100 includes a plurality of bonding pads 103 as input/output terminals of the integrated circuit and the micromechanical components. The bonding pads are disposed in the peripheral areas 103a of the chip.

As mentioned above, the micromechanical components 102 may include actuators, motors, sensors, spatial light modulators, and deformable mirror devices. By way of example and purposes of illustration, micromechanical components 102 are digital micromirror devices (DMD), as manufactured by Texas Instruments Incorporated of Dallas, Tex., U.S.A.

Structures and methods of micromechanical devices according to the invention are illustrated by way of example in two process flows and mold configurations. Process flow A is depicted in FIGS. 1A to 7A. It combines the first embodiment of the invention, namely the use of bonding wires or ribbons, and the third embodiment of the invention, namely the use of an electrically insulating substrate with integral conductive routing lines. Process flow B is depicted in FIGS. 1B to 7B. It combines the second embodiment of the invention, namely the use of solder, and the fourth embodiment of the invention, namely the use of a leadframe.

Process Flows A and B. Step 1: Singulating Chip

In well-known fashion, a plurality of chips 100 has been fabricated in a whole semiconductor wafer. As the final step of the wafer fabrication process, the chips are singulated, commonly by sawing.

Process Flow A. Step 2: Forming Substrate

Figure 2A:
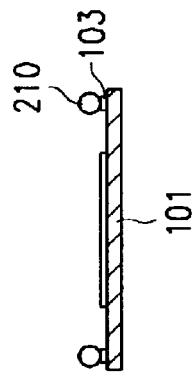
FIG. 2A illustrates the step of attaching the chip to the substrate.

In FIG. 2A, an electrically insulating substrate 201 is shown with a first surface 201a and a second surface 201b. The substrate is formed so that it has a plurality of conductive routing lines integral with the substrate and patterned from multilevel metal layers embedded in the substrate (not shown in FIG. 2A). Further, the substrate has a first plurality of terminals 202 on the first surface, intended for wire bond connections, and a second plurality of terminals 203 on the second surface, intended for solder connection to the "outside world". The terminals are electrically connected with the routing lines, respectively.

The insulating substrate is selected from a group consisting of flexible films made of polymers, polyimides or epoxies, and sheet-like boards made of FR-4, FR-5, BT resin, or glass-fiber strengthened dielectrics. Insulating substrates are commercially available, for instance Novaclad® and ViaGrid® from Sheldahl, Inc., Northfield, Minn. They are typically fabricated by laminating alternative films of electrically insulating and electrically conducting materials into one coherent layer. Connections through individual insulating films are made by laser drilling and metal refilling or plating, and patterning of the conductive films is achieved by ablating or etching. There are numerous designs and variations of insulating substrates available.

Process Flow A. Step 3: Attaching Chip to Substrate

As FIG. 2A indicates, chip 101 is attached to the first surface 201a of substrate 201. Typically, an epoxy adhesive is used for attaching; however, a polyimide adhesive may also be useful.

Process Flow B. Step 2: Attaching Solder Balls to Chip Bonding Pads

Figure 2B:
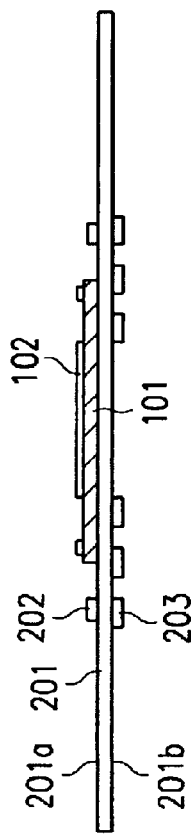
FIG. 2B illustrates the step of attaching solder balls as coupling members to the chip bonding pads.

In the second embodiment of the present invention, solder balls 210 are attached to the bonding pads 103 or chic 101; see FIG. 2B. The solder will connect to the substrate routing lines or the leads of a leadframe.

As used herein, the term solder "ball" does not imply that the solder contacts are necessarily spherical; they may have various forms, such as semispherical, half-dome, truncated cone, or generally bump, or a cylinder with straight, concave or convex outlines. The exact shape is a function of the deposition technique (such as evaporation, plating, or pre-fabricated units) and reflow technique (such as infrared or radiant heat), and the material composition. Generally, a mixture of lead and tin is used; other materials include indium, alloys of tin/indium, tin silver, tin/bismuth, other lead-free compounds, or conductive adhesive compounds. The melting temperature of the solder balls used for chip 101 may be different from the melting temperature of the solder balls used for other chips, or the solder balls used for connecting the module to the outside world. Several methods are available to achieve consistency of geometrical shape by controlling amount of material and uniformity of reflow temperature. Typically, the diameter of the solder balls ranges from 0.1 to 0.5 mm, but can be significantly larger.

Process Flow A. Step 4: Wire Bonding

Figure 3A:
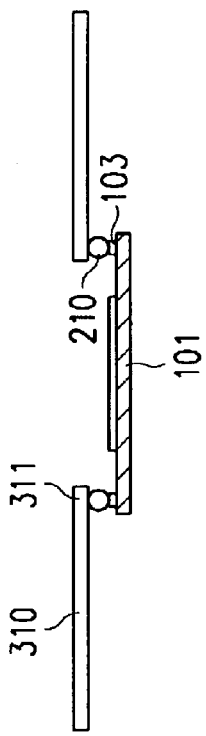
FIG. 3A illustrates the step of connecting the chip bonding pads to the substrate routing lines using bonding wires as coupling members.

In FIG. 3A, wire ball bonding is employed to connect the chip bonding pads 103 to the terminals 202 on the first surface 201a of substrate 201. The wire bonding process begins by positioning both chip and substrate on a heated pedestal to raise their temperature to between 170 and 300° C. A wire 301 typically of gold, gold-beryllium alloy, other gold alloy, or copper, having a diameter typically ranging from 18 to 33 µm, is strung through a heated capillary where the temperature usually ranges between 200 and 500° C. At the tip of the wire, a free air ball is created using either a flame or a spark technique. The ball has a type diameter from about 1.2 to 1.6 wire diameters. The capillary is moved towards the chip bonding pad 103 and the ball is pressed against the metallization of the bonding pad (typically aluminum, aluminum-copper alloy, or copper). For pads of aluminum, a combination of compression force and ultrasonic energy creates the formation of gold-aluminum intermetallics and thus a strong metallurgical bond. At time of bonding, the temperature usually ranges from 150 to 270° C. In the case of copper wire on copper pad, only metal interdiffusion takes places in order to generate the strong weld.

Alternatively, wedge bonding can be used to attach the wire to the bonding pad. This technique is favored when bonding ribbon is used instead of wire.

It is important for the present invention that recent technical advances in wire bonding now allow the formation of small yet reliable ball contacts and tightly controlled shape of the wire loop. Ball pitches as small as between 75 and 40 µm can be achieved. Such advances can, for instance, be found in the computerized bonder 8020 by Kulicke & Soffa, Willow Grove, Pa., U.S.A., or in the ABACUS SA by Texas instruments, Dallas, Tex., U.S.A. Moving the capillary in a predetermined and computer-controlled manner through the air will create a wire looping of exactly defined shape. For instance, with recent technical advance, rounded, trapezoidal, linear and customized loop paths can be formed. Finally, the capillary reaches its desired destination, for instance terminal pad 202. The capillary is lowered to touch the pad; with an imprint of the capillary, a metallurgical stitch bond is formed, and the wire is flamed off to release the capillary. Stitch contracts are small yet reliable; the lateral dimension of the stitch imprint is about 1.5 to 3 times the wire diameter (its exact shape depends on the shape of the capillary used, such as capillary wall thickness and capillary footprint). Consequently, the area of the terminal pads 202 can be designed small.

It is further important for the present invention that recent technical advances allow the formation of the wire looping with a minimum length of bonding wire by moving the bonding capillary the shortest feasible distance over the first surface 201a of the substrate 201. As a consequence, the looping of wires 301 can cross the substrate 201 at a height of approximately 10 µm and approach the pad surface at a low angle. At the stitch, there is no minimum height for a ball needed, nor is there a heat-affected wire zone, which would be mechanically weak for bending or other deformation stresses. Further, because of this minimum wire looping, high looping spans are no longer an issue.

Together, the progress in wire bonding technology provides makes chip-scale molded packages for micromechanical devices feasible.

Process Flow B. Step 3: Forming Leadframe

For example and illustration purposes, FIGS. 3B to 7B describe the use of a leadframe for the present invention in only one specific variation. For anyone skilled in the art, however, it will be easy to modify and vary the description in order to adopt and extend the use of leadframes for modified designs and processes.

The leadframe for semiconductor devices was invented (U.S. Pat. Nos. 3,716,764 and 4,034,027) to serve several needs of semiconductor devices and their operation simultaneously: First of all, the leadframe provides a stable support pad for firmly positioning the semiconductor chip. Since the leadframe including the pads is made of electrically conductive material, the pad may be biased, when needed, to any electrical potential required by the network involving the semiconductor device, especially the ground potential. This part of the leadframe (chip pad) is not shown in FIGS. 3B to 7B.

Secondly, the leadframe offers a plurality of conductive segments to bring various electrical conductors into close proximity of the chip. The remaining gap between the ("inner") tip of the segments and the conductor pads on the IC surface are typically bridged by thin metallic wires, individually bonded to the IC contact pads and the leadframe segments. For one embodiment of the present invention, the inner leads are modified to be soldered to the chip bonding pads.

Thirdly, the ends of the lead segment remote from the IC chip ("outer" tips) need to be electrically and mechanically connected to "other parts" or the "outside world", for instance to assembly printed circuit boards. In the overwhelming majority of electronic applications, this attachment is performed by soldering. Obviously, the technique of soldering implies that reliable wetting and solder contact can be performed at the (outer) segment tips.

It has been common practice to manufacture single piece leadframes from thin (about 120 to 250 $\mu$m) sheets of metal. For reasons of easy manufacturing, the commonly selected starting metals are copper, copper alloys, iron-nickel alloys for instance the so-called "Alloy 42"), aluminum and invar. The desired shape of the leadframe is etched or stamped from the original sheet. In this manner, an individual segment of the leadframe takes the form of a thin metallic strip with its particular geometric shape determined by the design. For most purposes, the length of a typical segment is considerably longer than its width.

In the European patent #0 335 608 B1, issued 14 Jun 1995 (Abbott, "Leadframe with Reduced Corrosion"), a palladium-plated leadframe is introduced which is not subject to corrosion due to galvanic potential forces aiding the migration of the base metal ions to the top surface where they will form corrosion produces. The patent describes a sequence of layers consisting of nickel (over the base metal), palladium/nickel alloy, nickel, and palladium (outermost).

Nickel/palladium plated leadframes are used for the present invention. The leadframes shown in FIGS. 3B to 7B, therefore, comprise insensitivity to corrosion, good solderability for inner and outer lead attachments, good adhesion to molding compounds, and ductility for forming and bending the segments.

Figure 3B:
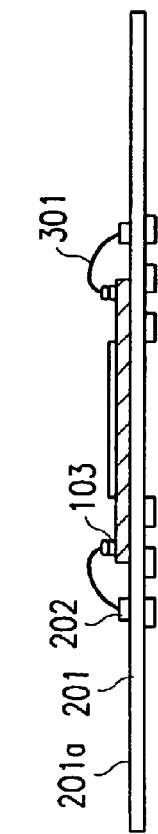
FIG. 3B illustrates the step of connecting the inner leads of a leadframe to the soldier balls on the chip.

FIG. 3B depicts the leads 310 of a metallic leadframe to be used for contacting solder balls 210 attached to the chip bonding pads 103. When device variations require maximum thermal performance, direct heat dissipation from the silicon chip 101 to the ambient may be the best solution, and the leadframe is used without chip pad, as in the example of FIG. 3B. When a chip pad is employed, however, the chip is first attached to the pad using a polymerizable epoxy or polyimide adhesive, before solder attaching the leadframe.

Process Flow B. Step 4: Solder Attaching Leadframe

It is well known that copper leadframes plated by a nickel layer, followed by a palladium layer, are easily attached by soldering. In the soldering process, the palladium is dissolved by the solder, which is then wetting the clean underlying nickel uniformly and perfectly. The reflow temperature of the solder can be chosen compatible with the device sensitivities by selecting the appropriate solder alloy.

As schematically indicated in FIG. 3B, the tips 311 of the inner segments of the leadframe are attached to the chip bonding pads 103 by the solder material ("balls") 210.

Process Flows A and B. Step 5: Molding

Figure 8A:
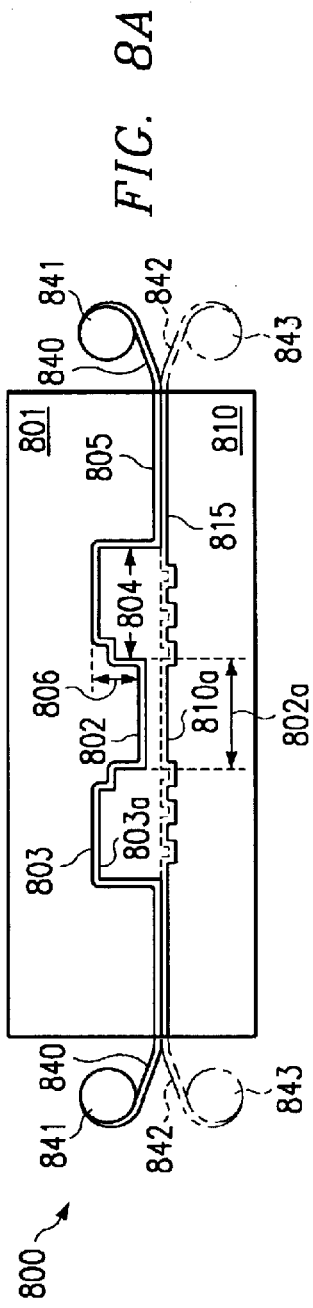
FIG. 8A is a schematic and simplified cross section of the top and bottom halves of the molding apparatus designed according to the invention for "3P"-transfer molding a micromechanical device having its chip wire-bonded to a substrate. The method employs protective plastic films on the surfaces of the mold cavities.

The micromechanical chip, assembled according to process steps 1 through 4 is placed into a mold to perform the encapsulating transfer molding process step. For Process Flow A, the mold is shown in FIG. 8A, generally designated 800. The mold comprises the top half 801 and the bottom half 810, each having a cavity for holding the respective portions of the assembled device.

The present invention applies the 3P-Technology to the encapsulation of micromechanical devices. In the molding process, the flow rate of the compound is controlled by the piston force pressing the compound, the lengths and cross section of the runners, the cross section of the gates, the temperature of the transfer operation, and the viscous and flow characteristics of the compound.

Figure 8B:
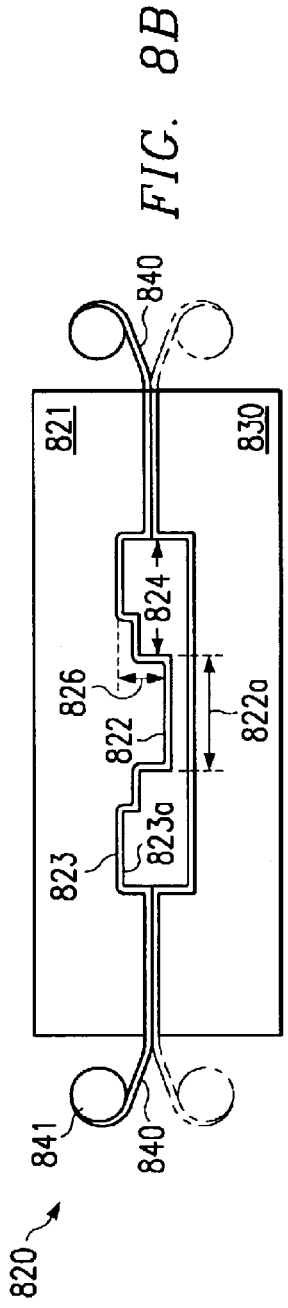
FIG. 8B is a schematic and simplified cross section of the top and bottom halves of the molding apparatus designed according to the invention for "3P"-transfer molding a micromechanical device having its chip solder-connected to a leadframe. The method employs protective plastic films on the surfaces of the mold cavities.

Most important, the mold cavities, the runners and gates have thin elastic films on their inner walls, as indicated in FIGS. 8A and 8B by films 840 stretched continuously between the reels 841. Rather than the typical 5 $\mu$m film thickness, the present invention prefers a film thickness of about 50 $\mu$m in order to soft-touch the micromechanical devices. Preferred material is polyimide. Pulled by vacuum suction through tiny holes in the walls of the mold halves, the film follows the contours of the mold cavity walls carefully and prevents contact between the molding compound and the walls. The film also protects the compound against influences from the environment.

The feature of no-contact between compound and walls allows the use of lower cost mold materials (such as ceramics) compared to the traditional special steel for fabricating the mold equipment. Furthermore, it allows the application of extra high adhesion materials without running a risk that the material may stick to the mold walls. Consequently, the high adhesion capability can be fully utilized for insuring strong adhesion to the widely different materials found in micromechanical devices (parts made of semiconductor, metals, insulators, inorganic or organic materials, etc.). High mechanical stress tolerance of the finished device is thus guaranteed—an essential prerequisite for devices with minimum thickness.

The encapsulation compounds especially suitable and developed for high adhesion comprise epoxy-based thermoset resins and silicone-based elastomerics. They are commercially available from Shin Etsu Chemical Corporation, Japan, or Kuala Lumpur, Malaysia; Sumitomo Bakelite Corporation, Japan, or Singapore, Singapore; and Hitachi Chemical, Japan. In addition, thermoplastics as well as liquid-crystal polymers are suitable.

In addition to high adhesion, these encapsulation materials exhibit very low viscosity at molding temperatures (while solid at room temperature). With this feature, even minute spaces found in thin semiconductor chip-scale packages can be reliably filled with encapsulation material. Voids or other cosmetic defects, which plague thin devices made by conventional technology, are completely eliminated.

Typical compound formulations comprise viscosities in the range from 30 to 200 poise, glass transition temperatures from 100 to 230° C., and filler sizes from 1 to 75 $\mu$m with a median from 15 to 25 $\mu$m (fillers are needed to lower the coefficient of thermal expansion and increase the strength and flexibility of the molding material). The molding process parameters are recommended in the following ranges: Molding temperature from 140 to 220° C. (preferred temperature 175° C.), cure times from 70 to 120 s, clamping pressure from 18 to 33 tons, transfer time from 5 to 18 s, transfer pressure: initial pressure from 50 to 80 kg/cm$^2$, final pressure from 15 to 30 kg/cm$^2$. With these materials and process parameters, molded thicknesses as low as 0.25 to 0.3 mm are achievable.

The design of the molding apparatus is essential for the present invention. Top half 801 provides a flat portion 802, located in the center of the top half, mirror-imaging the location of the plurality of micromechanical components. The flat portion 802 exhibits the general outline of the plurality of components, and an area equal to the area of the plurality of the components (one linear dimension is designated 802a in FIG. 8A). The elevation 806 of the flat portion 802 is designed so that flat surface 802, covered by the polyimide film, will uniformly contact the surface of the micromechanical components, and will be in a plane parallel to the plane of the components, when the two mold halves are operated into mold-closed position.

As defined herein, the term "outline" relates first to the overall width and length of the plurality of micromechanical components. Second, the term "outline" relates to the overall length and width of the package; in this connection, it is also referred to as the footprint of the package, because it defines the surface area on a wiring or assembly board that the package will occupy. Chip-scale packages have an outline adding less than 20% to the chip area. The terms "substantially similar" and "substantially the same" refer to the relative outlines of certain parts of the package and the chip when they are within 10% of one another.

Top half 801 further provides portions 803, which are designed to define the surfaces of the selective encapsulating body of the device. Those surfaces have to be flat and smooth and, located in a plane parallel to the plane of the micromechanical components, since they are intended to support the attached lid of the completed device. The goal of smoothness at locations 803a is easily achieved in 3-P technology thanks to the thin plastic film covering the mold surface 803. In contrast, standard molding technology can achieve such smoothness only by careful polishing of the mold surfaces—a very expensive method. The encapsulating body has the general shape of a peripheral frame, molded such that it surrounds the centrally located components. The width 804 of the frame is designed so that it creates molded material selectively encapsulating the chip bonding pads 103, the coupling members 301, and the substrate terminals 202 (see FIG. 3A)

The mold 800 is further designed so that either the top half 801 or the bottom half 810 has a plurality of runners and a plurality of gates for feeding encapsulation material into the cavities (not shown in FIG. 8A). The bottom half 810 is also covered by thin polyimide film 852 from reel 843 to reel 843, as indicated by dashed lines in FIG. 8A.

The molding process starts by positioning the substrate together with the assembled chip (see FIG. 3A) into the boom mold half 810 (see FIG. 8A) so that the micromechanical components are positioned away from the bottom mold half surface 810a. Next, the mold is closed by clamping the top half 801 onto the bottom half 810 and forming a tight seal at the surfaces 805 and 815.

Next, encapsulation material is pressures through the runners and gates into the top and bottom cavities. Flowable encapsulation material is thus deposited on the peripheral areas of the assembled chip; it engulfs and protects the sensitive coupling members 301 and bonding pads 103.

It is common practice to leave the freshly molded device in the mold until the material is at least partially cured. The time required depends on the molding compound selected; it is typically between 30 s and 2 min. In this polymerization process, the molding compound hardens enough to allow opening of the mold. Next, the encapsulated device is removed from the mold.

The device has an appearance as indicated in FIG. 4A. It consists of the chip 101, assembled on the substrate 201, and the molded frame 401 characterized by the flat surfaces 401a in a plane parallel to the plane of the micromechanical components 102. The space above the components 102 is left empty. The polymerization of the molding compound is completed by an additional curing cycle lasting from about 30 min to 6 h, depending on the compound selected.

For process Flow B, the mold is shown in FIG. 8B, generally designated 820. The mold comprises the top half 821 and the bottom half 830, each having a cavity for holding the respective portions of the assembled device. In contrast to the mold in FIG. 8A, mold 820 has a relatively deeper cavity in the bottom half 830 and consequently a relatively shallower cavity in the top half 821. The shape of the assembled device depicted in FIG. 3B determines the shape and relative depths of the cavities 821 and 830.

However, top half 821 again provides a flat portion 822, located in the center of the top half, mirror-imaging the location of the plurality of micromechanical components. The flat portion 822 exhibits the general outline of the plurality of components, and an area equal to the area of the plurality of the components (one linear dimension is designated 822a in FIG. 8B). The elevation 826 of the flat portion 822 is designed so that flat surface 822, covered by the polyimide film, will uniformly contact the surface of the micromechanical components, and will be in a plane parallel to the plane of the components, when the two mold halves are operated into mold-closed position.

Top half 821 further provides portions 823, which are designed to define the surfaces of the selective encapsulating body of the device. They are structured and manufactured similar to portions 803 in FIG. 8A, especially concerning the flat and smooth surfaces 823a and the width 824.

The mold 820 is further designed so that either the top half 321 or the bottom half 830 has a plurality of runners and a plurality of gates for feeding encapsulation material into the cavities (not shown in FIG. 8B)

The molding and curing processes are analogous to the ones in Process Flow A described above. After removing the encapsulated device from the mold, it has an appearance as indicated in FIG. 4B. It consists of the chip 101, assembled on the leadframe 310, and the molded frame 410 characterized by the flat surfaces 410a in a plane parallel to the plane of the micromechanical components 102. The space above components 102 is left empty.

Process Flows A and B. Step 6: Activating Components

In the preferred method, the next process step is the activation of the micromechanical components. In the case of micromirror devices, this step consists of removing the photoresist under the mirrors and activating the components using plasma etch or a combination of a plasma etch/UV cure process to remove any contaminates from the surfaces of the components 102.

Process Flows A and B. Step 7: Inserting Passivant

Molds as illustrated in FIGS. 8A and 8B are capable of creating ridge-like molded protrusions, such as indicated by 402 in FIG. 4A, and 412 in FIG. 4B. These protrusions are located between the molded frame surfaces 401a and 410a, respectively, and the micromechanical components 102. They serve the purpose or storing chemical compounds intended to remain inside the package volume after closure by the covering lid. These chemicals are typically supplied as pills or granular material. In FIGS. 5A and 5B, they are generally designated 501.

For micromirror devices, such chemicals are suitable for releasing passivants continuously for the lifetime of the device in order to coat all contacting surfaces of the micromechanical devices. More detail about composition, operation and method of metered deposition can be found in the above-quoted U.S. Pat. Nos. 5,939,785 and 5,936,758.

Process Flows A and B. Step 8: Attaching Lid

Right after the deposition of any chemical compound 501, a lid 601 is attached to close the package, as shown in FIGS. 6A and 6B. Typically, lids 601 have to be cleaned from impurities and dehydrated by baking in reduced-pressure environment before attachment. Afterwards, they are attached to the smooth, flat surfaces of the molded frame, preferably using an epoxy adhesive. Temperature and time needed to polymerize the adhesive also serve to sublimate an amount of the passivant 501 within the package so that the active surfaces of the micromechanical components 102 are coated with at least a monolayer of the passivant.

For micromirror devices, lid 601 is a plate made of glass or any other material transparent to light in the visible range of the electromagnetic spectrum. Requirements for optical flatness of the plate are described in quoted U.S. Pat. No. 5,939,785. Care has to be taken that attached lid 601 is in a plane parallel to the plane of the plurality of micromirrors 102.

Process Flows A and B. Step 9: Marking

The package of the enclosed micromechanical components is marked with identification such as device type and number, fabrication information, country of origin, etc.

Process Flow A. Step 10: Trimming/Singulation

As indicated in FIG. A, substrate 201 is trimmed to match the size of the package. In the preferred embodiments, this is a chip-scale package. Exhibiting a plurality of terminals 203 (typically copper, often with a gold-flash surface) on the second surface 201b of substrate 201, the micromechanical device package is of the "land grid array" type.

Process Flow B. Step 10: Trimming/Forming

Figure 7A:
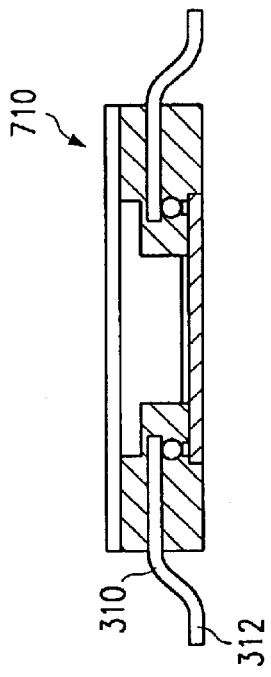
Figure 7B:
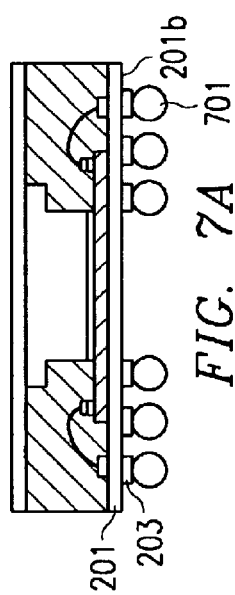

As indicated in FIG. 7B, the outer segments 312 of leadframe 310 are trimmed and formed suitable for surface mount attachment to circuit or motherboards. Since surface mounting is commonly performed by solder reflow, formed segments 312 may have a nickel-and-palladium plated surface (see Process Flow B, Step 3), or a solder plated surface, as described in U.S. Patent Application No. 60/138,070, dated Jun. 08, 1999. The example of lead forming illustrated in FIG. 7B is of the "gull wing" type, typically used for "small outline" semiconductor devices. The finished molded micromechanical device, generally designated 710 in FIG. 7B, is therefore a "leaded small outline" device.

Process Flow A. Step 11: Attaching Solder Balls

Solder "balls" 701 may be attached to the substrate terminals 203 in FIG. 7A. The solder balls may be a conventional lead/tin alloy, or a lead-free mixture as described above. The diameter can vary widely; typical size range from 0.5 to 1.5 mm. With solder balls attached, the finished molded "and grid array" package is transformed into a type of "ball grid array" package, as used widely in modern electronic applications.

After electrical testing the leaded small outline device and the land grid array/ball grid array device, the finished molded micromechanical device is ready for packing and shipping.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, the heights consumed for chip assembly and package molding can be minimized in order to reduce the thickness of the device. The invention can be applied to the manufacture of "thin" small outline packages and "thin" land grid/ball grid array packages.

As another example, important for several device applications, the first embodiment (featuring bonding wires) can be combined with the fourth embodiment (featuring leadframes). This combination creates a low-cost micromechanical device package characterized by the mature technologies or wire bonding and surface mounting. This combination is particularly attractive in combination with the "3-P" technology described above. The low viscosity molding compounds employed by the present invention allow an encapsulation of the device without disturbing the thin bonding wires (so-called "wire sweep") looped close to the chip surface. As another example, the invention can be extended to batch processing, further reducing packaging cost. It is therefore intended that the appended claims encompass any such modifications or embodiments.

We claim:

1. A packaged micromechanical device, comprising:

a substrate having a first surface and a second surface, said first surface having a first plurality of terminals thereon, and said second surface having a second plurality of terminals thereon, selected ones of said first plurality of terminals coupled to selected ones of said second plurality of terminals;

an integrated circuit comprising micromechanical components in a central region and bond pads in a peripheral region, said integrated circuit mounted on said first surface of said substrate in proximity to said first plurality of terminals;

bond wires connecting said bond pads to selected ones of said first plurality of terminals;

encapsulation material disposed over a portion of said first surface of said substrate and said integrated circuit covering said bond pads, said bond wires, and said selected ones of said first plurality of terminals to which said bond wires are connected, said micromechanical components being uncovered by said encapsulation material, and a visible light permeable cover disposed over said encapsulation material and spaced from the central region of said micromechanical device, said encapsulation material extending sufficiently above said central region to permit uninhibited movement of said micromechanical components beneath said cover.

2. The packaged micromechanical device of claim 1, wherein said encapsulation material surrounds said micromechanical components.

3. The packaged micromechanical device of claim 2, wherein said encapsulation material comprises a flat top surface and a molded protrusion extending toward said micromechanical components, said molded protrusion having a top surface lower than said flat top surface.

4. The packaged micromechanical device of claim 3, further comprising a passivant releasing chemical compound on said molded protrusion.

5. The packaged micromechanical device of claim 1, wherein said cover is glass.

6. A packaged micromechanical device, comprising:

a leadframe comprising leads having inner sections and outer sections arranged around a central chip pad;

an integrated circuit comprising micromechanical components in a central region and bond pads in a peripheral region, said integrated circuit mounted on said chip pad;

bond wires connecting selected ones of said bond pads to selected ones of said inner sections of said leads;

encapsulation material disposed over said inner sections of said leads and said integrated circuit covering said bond pads and said bond wires, said micromechanical components being uncovered by said encapsulation material, and a visible light permeable cover disposed over said encapsulation material and spaced from the central region of said micromechanical device, said encapsulation material extending sufficiently above said central region to permit uninhibited movement of said micromechanical components beneath said cover.

7. The packaged micromechanical device of claim 6, wherein said encapsulation material surrounds said micromechanical components.

8. The packaged micromechanical device of claim 7, wherein said encapsulation material comprises a flat top surface and a molded protrusion extending toward said micromechanical components, said molded protrusion having a top surface lower than said flat top surface.

9. The packaged micromechanical device of claim 8, further comprising a passivant releasing chemical compound on said molded protrusion.

10. The packaged micromechanical device of claim 6, wherein said cover is glass.

11. A packaged micromechanical device, comprising:
- a leadframe comprising leads having inner sections and outer sections arranged around a central area;
- an integrated circuit comprising micromechanical components in a central region and bond pads in a peripheral region, said integrated circuit mounted over said central area of said leadframe, selected ones of said bond pads attached to selected ones of said inner sections of said leads;
- encapsulation material disposed over said inner sections of said leads and said integrated circuit covering said bond pads and said inner sections of said leads, said micromechanical components being uncovered by said encapsulation material, and
- a visible light permeable cover disposed over said encapsulation material and spaced from the central region of said micromechanical device, said encapsulation material extending sufficiently above said central region to permit uninhibited movement of said micromechanical components beneath said cover.

12. The packaged micromechanical device of claim 11, wherein said integrated circuit comprises a back side opposite the side of said integrated circuit comprising micromechanical components, and further wherein said back side is not covered by said encapsulation material.

13. The packaged micromechanical device of claim 11, wherein said encapsulation material surrounds said micromechanical components.

14. The packaged micromechanical device of claim 13, wherein said encapsulation material comprises a flat top surface and a molded protrusion extending toward said micromechanical components, said molded protrusion having a top surface lower than said flat top surface.

15. The packaged micromechanical device of claim 14, further comprising a passivant releasing chemical compound on said molded protrusion.

16. The packaged micromechanical device of claim 11, wherein said cover is glass.

* * * * *